(12) United States Patent
Ding et al.

(10) Patent No.: US 7,269,231 B2
(45) Date of Patent: Sep. 11, 2007

(54) SYSTEM AND METHOD FOR PREDISTORTING A SIGNAL USING CURRENT AND PAST SIGNAL SAMPLES

(75) Inventors: Lei Ding, Atlanta, GA (US); Zhengxiang Ma, Summit, NJ (US); Dennis Raymond Morgan, Morristown, NJ (US); Michael George Zierdt, Belle Mead, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 918 days.

(21) Appl. No.: 10/159,540

(22) Filed: May 31, 2002

(65) Prior Publication Data

US 2003/0223508 A1 Dec. 4, 2003

(51) Int. Cl.
*H04K 1/02* (2006.01)
*H04L 25/49* (2006.01)

(52) U.S. Cl. ............... 375/296; 375/284; 375/285; 455/114.3

(58) Field of Classification Search ........ 375/296, 375/285, 286, 284, 254, 295, 297; 455/127, 455/114; 330/149
See application file for complete search history.

(56) References Cited

U.S. PATENT DOCUMENTS

| | | | | |
|---|---|---|---|---|
| 4,849,991 A | * | 7/1989 | Arnold et al. | 375/330 |
| 5,414,732 A | * | 5/1995 | Kaufmann | 375/232 |
| 5,703,903 A | * | 12/1997 | Blanchard et al. | 375/232 |
| 5,778,029 A | * | 7/1998 | Kaufmann | 375/296 |
| 6,246,286 B1 | * | 6/2001 | Persson | 330/149 |
| 6,275,103 B1 | * | 8/2001 | Maniwa | 330/149 |
| 6,794,939 B2 | * | 9/2004 | Kim et al. | 330/149 |

OTHER PUBLICATIONS

U.S. Appl. No. 09/915,042, filed Jul. 25, 2001, C.R. Giardina et al., "System and Method for Predistorting a Signal Using Current and Past Signal Samples."
U.S. Appl. No. 09/928,628, filed Aug. 13, 2001, C.R. Giardina et al., "Multiple Stage and/or Nested Predistortion System and Method."

* cited by examiner

*Primary Examiner*—Mohammed Ghayour
*Assistant Examiner*—Qutub Ghulamali

(57) ABSTRACT

A signal is predistorted by producing a set of sample values, each of at least a subset of which is dependent on (i) at least one of a plurality of past time spaced input samples and (ii) a current time spaced input sample, and independent of any other time spaced input sample, and combining the sample values to produce the predistorted signal. Predistortion circuitry for generating the predistorted signal may be implemented using multiple predistortion core circuits, with each of the predistortion core circuits receiving a data input and an index input associated with a particular input sample and generating a corresponding data output. The data outputs of the predistortion core circuits correspond generally to sample values. The predistortion circuitry may also include at least one memory finite impulse response (FIR) filter which processes one or more input samples in conjunction with the production of the sample values.

18 Claims, 5 Drawing Sheets

SYSTEM AND METHOD FOR PREDISTORTING A SIGNAL USING CURRENT AND PAST SIGNAL SAMPLES

RELATED APPLICATION(S)

The present invention is related to the inventions described in U.S. patent application Ser. No. 10/159,629 entitled "Signal Predistortion Using a Combination of Multiple Predistortion Techniques," and U.S. patent application Ser. No. 10/159,657 entitled "System and Method for Predistorting a Signal to Reduce Out-of-Band Error," both filed concurrently herewith and hereby incorporated by reference herein.

FIELD OF THE INVENTION

The present invention relates generally to signal processing, and more particularly to signal predistortion techniques for use in conjunction with power amplification or other nonlinear processing operations in a wireless communication system or other type of system.

BACKGROUND OF THE INVENTION

As is well known, signal predistortion techniques are used in conjunction with power amplification in order to correct for undesirable effects, such as output signal distortion, spectral regrowth and adjacent channel power (ACP), that are typically associated with amplifier nonlinearity at high output power levels. In general, predistortion techniques involve distorting an input signal prior to amplification in a manner that takes into account the transfer function characteristics of the amplifier, such that the nonlinearity-related effects are at least partially canceled out in the resulting output signal.

Recently-developed signal predistortion techniques which overcome one or more problems associated with conventional techniques are described in U.S. patent application Ser. No. 09/915,042, filed Jul. 25, 2001 and entitled "System and Method for Predistorting a Signal Using Current and Past Signal Samples," and U.S. patent application Ser. No. 09/928,628, filed Aug. 13, 2001 and entitled "Multiple Stage and/or Nested Predistortion System and Method," both of which are hereby incorporated by reference herein.

Despite the considerable advances provided by the predistortion techniques described in the above-cited U.S. patent applications Ser. Nos. 09/915,042 and 09/928,628, a need remains for further improvements in predistortion techniques, so as to provide additional performance enhancements in wireless communication systems and other systems employing power amplification.

SUMMARY OF THE INVENTION

In accordance with one aspect of the invention, a signal is predistorted by producing a set of sample values each of at least a subset of which is dependent on (i) at least one of a plurality of past time spaced input samples and (ii) a current time spaced input sample, and independent of any other time spaced input sample, and combining the sample values to produce a predistorted signal.

In one illustrative embodiment of the invention, the predistorted signal is of the form given by the following equation:

$$y(n) = x(n) \cdot f\left(\sum_{l=0}^{L} c_l |x(n-l)|\right),$$

where $y(n)$ denotes the predistorted signal, $x(n)$ denotes a corresponding input signal, $f$ denotes a function, and $c_l$ are coefficients of one or more memory filters used in producing at least a portion of the set of sample values.

In another illustrative embodiment of the invention, the predistorted signal is of the form given by the following equation:

$$y(n) = x(n) \cdot \sum_{l=1}^{L} f_l(|x(n-l)|),$$

where again $y(n)$ denotes the predistorted signal, $x(n)$ denotes a corresponding input signal, and $f_l$ denotes a function.

In accordance with another aspect of the invention, the quantity l in the above equations may be permitted to have a value which is less than zero, such that one or more future time spaced input samples are utilized in generating the set of sample values.

In accordance with a further aspect of the invention, predistortion circuitry for generating the predistorted signal may be implemented using a plurality of predistortion core circuits, each of the predistortion core circuits receiving a data input and an index input associated with a particular input sample and generating a corresponding data output. More particularly, a given one of the predistortion core circuits includes a first processing element comprising at least one of a coefficient lookup table and a polynomial generator, the first processing element receiving the index input and generating an output which is applied to a second processing element comprising a multiplier which multiplies the output of the first processing element and the data input to generate the corresponding data output. The data outputs of the predistortion core circuits each correspond generally to one or more of the sample values.

The predistortion circuitry also preferably includes at least one memory finite impulse response (FIR) filter which processes at least one input sample. For example, the memory FIR filter may generate an output which is supplied to a predistortion core circuit in the predistortion circuitry, with the predistortion core circuit producing at least a subset of one or more of the sample values.

These and other features and advantages of the present invention will become more apparent from the accompanying drawings and the following detailed description.

DETAILED DESCRIPTION OF THE INVENTION

The present invention will be illustrated below in conjunction with exemplary predistortion techniques and associated circuitry particularly well-suited for use in a base station of a wireless communication system. It should be understood, however, that the invention is not limited to use with any particular type of predistortion circuit or nonlinear system application, but is instead more generally applicable to any application which can benefit from the improved predistortion techniques of the invention.

Figure 1:
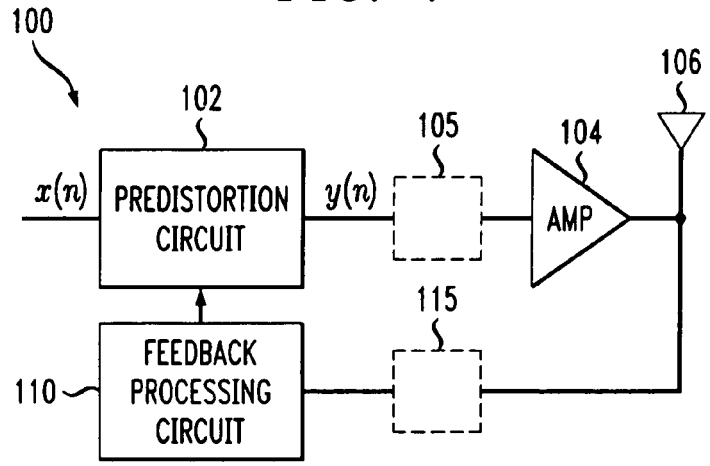
FIG. 1 shows a simplified diagram of a portion of a communication system in which the present invention may be implemented.

FIG. 1 shows a simplified block diagram of a portion of a communication system 100 in which the present invention may be implemented. The portion of the system 100 shown in the figure may correspond, for example, to one or more signal transmission channels of a wireless communication system base station.

The portion of the system 100 as shown includes a predistortion circuit 102 coupled to an amplifier 104. An input signal x(n) applied to an input of the predistortion circuit is predistorted therein to generate a predistorted output signal y(n). The predistorted signal y(n) is generally subject to further processing before the resulting processed signal is applied to an input of the amplifier 104. These operations are collectively denoted by the dashed box 105 in the figure, and may include, by way of example and not limitation, operations such as digital-to-analog conversion, upconversion and filtering. Such operations are well-known to those skilled in the art, and are therefore not described in further detail herein. It is to be appreciated that the invention does not require the performance of any particular operation or set of operations in box 105, although any operations implemented therein clearly should have sufficient bandwidth to accommodate the predistorted signal.

The amplifier 104 amplifies the processed signal applied to its input and the resulting output signal is transmitted via an antenna 106 of the system 100. The output of the amplifier 104 is coupled via a predistortion feedback path to a feedback processing circuit 110 which processes the amplifier output signal to generate information utilized by the predistortion circuit 102. The amplifier output may be further processed before being supplied to the input of the feedback processing circuit 110, using one or more operations collectively illustrated as dashed box 115 in the figure. Such operations are generally complementary to those performed in box 105, and thus may include filtering, down-conversion, analog-to-digital conversion, and so on, and are configured with an appropriate bandwidth for implementing the predistortion feedback. The feedback processing circuit 110 is configured to generate information such as updated lookup table entries or predistortion polynomial coefficients for use by the predistortion circuit 102.

In the embodiment of FIG. 1, the predistorted output signal y(n) is also applied to an input of the feedback processing circuit 110, so as to be available for use in coefficient updating or other feedback processing operations implemented in circuit 110. However, this connection may be eliminated in other embodiments.

The particular feedback processing operations implemented in the feedback processing circuit may be of the type described in the above-cited U.S. patent applications Ser. Nos. 09/915,042 and 09/928,628. Other feedback processing operations known in the art may also be used. The present invention does not require the use of any particular coefficient updating or other feedback processing approach, and these operations will therefore not be described in further detail herein.

It is to be appreciated that the portion of the system 100 shown in FIG. 1 is simplified for clarity of illustration, and represents an example of one configuration of system elements that may utilize the techniques of the invention. Those skilled in the art will recognize that the predistortion techniques of the invention can be implemented in systems having other arrangements of signal processing and transmission elements. Moreover, the predistortion techniques of the invention can be implemented at baseband, intermediate frequency (IF) or radio frequency (RF), or using combinations of these frequency ranges, and so one or more of the input signal x(n) and the predistorted signal y(n) may represent baseband, IF or RF signals. Moreover, the techniques can be implemented in the digital or analog domains or in combinations thereof, although it should be noted in this regard that digital implementation is generally preferred in that it typically results in less complexity for predistortion operations such as polynomial generation.

Figure 2:
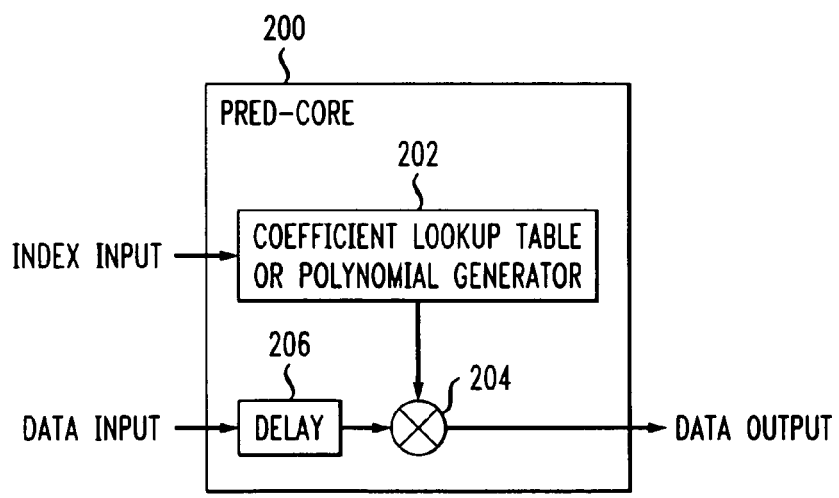
FIG. 2 shows an illustrative embodiment of a predistortion core suitable for use in implementing a predistortion circuit in the system of FIG. 1 in accordance with the invention.

FIG. 2 shows an example of a predistortion core circuit 200, also referred to herein as a "Pred-Core" circuit, which may be used to implement the predistortion circuit 102 in accordance with the invention. The Pred-Core circuit 200 includes a coefficient lookup table or polynomial generator 202 and a multiplier 204. The coefficient lookup table or polynomial generator 202 may comprise one or more coefficient lookup tables, one or more polynomial generators, or combinations of at least one coefficient lookup table and at least one polynomial generator. The multiplier 204 receives as inputs a data input and an output from element 202, and generates a data output. The data input is applied to the multiplier 204 via a delay element 206. The delay element 206 provides an amount of delay designed to match the processing delay associated with the coefficient lookup table or polynomial generator 202. The output from element 202 applied to the multiplier 204 is generated in accordance with an index input applied to element 202 as shown. If the data input, data output and index input are denoted as x(n), y(n) and z(n), respectively, the Pred-Core circuit 200 implements the following equation:

$$y(n) = x(n) \cdot f(z(n)), \qquad (1)$$

where $f(\ )$ denotes a polynomial function.

Examples of predistortion circuits in accordance with the invention that are implemented using the Pred-Core circuit 200 of FIG. 2 will now be described with reference to FIGS. 2 through 6. It should be understood that each of these circuits may be utilized as predistortion circuit 102 in the portion of system 100 shown in FIG. 1.

Figure 3A:
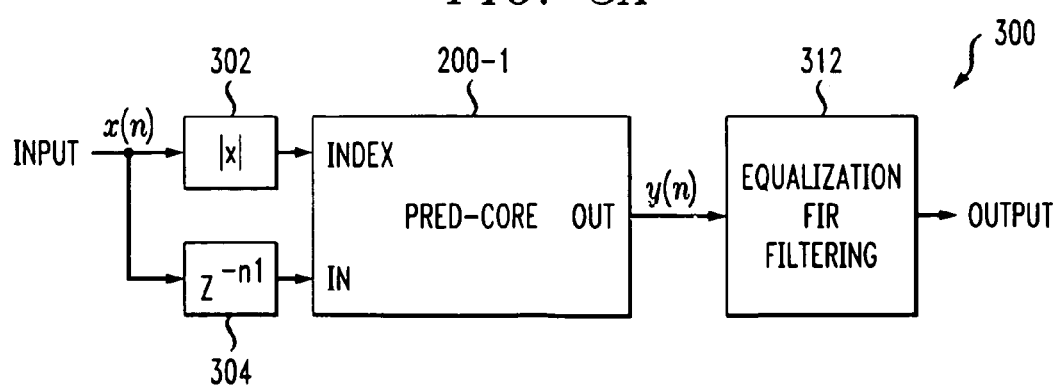
FIG. 3A shows an illustrative embodiment of a memoryless predistortion circuit in accordance with the invention, implemented using the predistortion core of FIG. 2 and suitable for use in the system of FIG. 1.

FIG. 3A shows an example of a memoryless predistortion circuit 300 that is implemented using single Pred-Core circuit 200 of the type described in FIG. 2. The input x(n) is applied to an absolute value element 302 and to a delay element 304. The delay n1 associated with the delay element 304 is designed to match the delay associated with the absolute value element 302, so as to provide matching of signal delays in the associated signal paths. These and other matching delays referred to herein are typically implementation-specific, and appropriate values for use in a given implementation can be determined in a straightforward manner by one of ordinary skill in the art. Typical values for n1 and other matching delays are less than about 10 sample periods.

The output of the delay element 304 is applied to the data input of a Pred-Core circuit 200-1. The output of the absolute value element 302 is applied to the index input of the Pred-Core circuit 200-1. The output of the Pred-Core circuit 200-1 corresponds to the output y(n). The circuit 300 in this embodiment further includes an equalization finite impulse response (FIR) filtering element 312, which may be eliminated in other embodiments because the circuit 300 has a certain limited amount of built-in equalization. The output of the circuit 300 may thus be viewed as the signal y(n) or a corresponding filtered version thereof.

As is apparent from the figure, the memoryless predistortion circuit 300 implements the following equation:

$$y(n) = x(n) \cdot f(|x(n)|), \tag{2}$$

where $f( )$ denotes a polynomial function associated with the Pred-Core circuit 200.

Although the memoryless predistortion circuit 300 provides acceptable performance in certain applications, such as applications involving narrowband transmission channels, improved performance can generally be provided through the use of memory to take into account one or more past signal samples. An example of a alternative version of the circuit 300 that is modified to incorporate memory elements will be described below with reference to FIG. 3B.

Figure 3B:
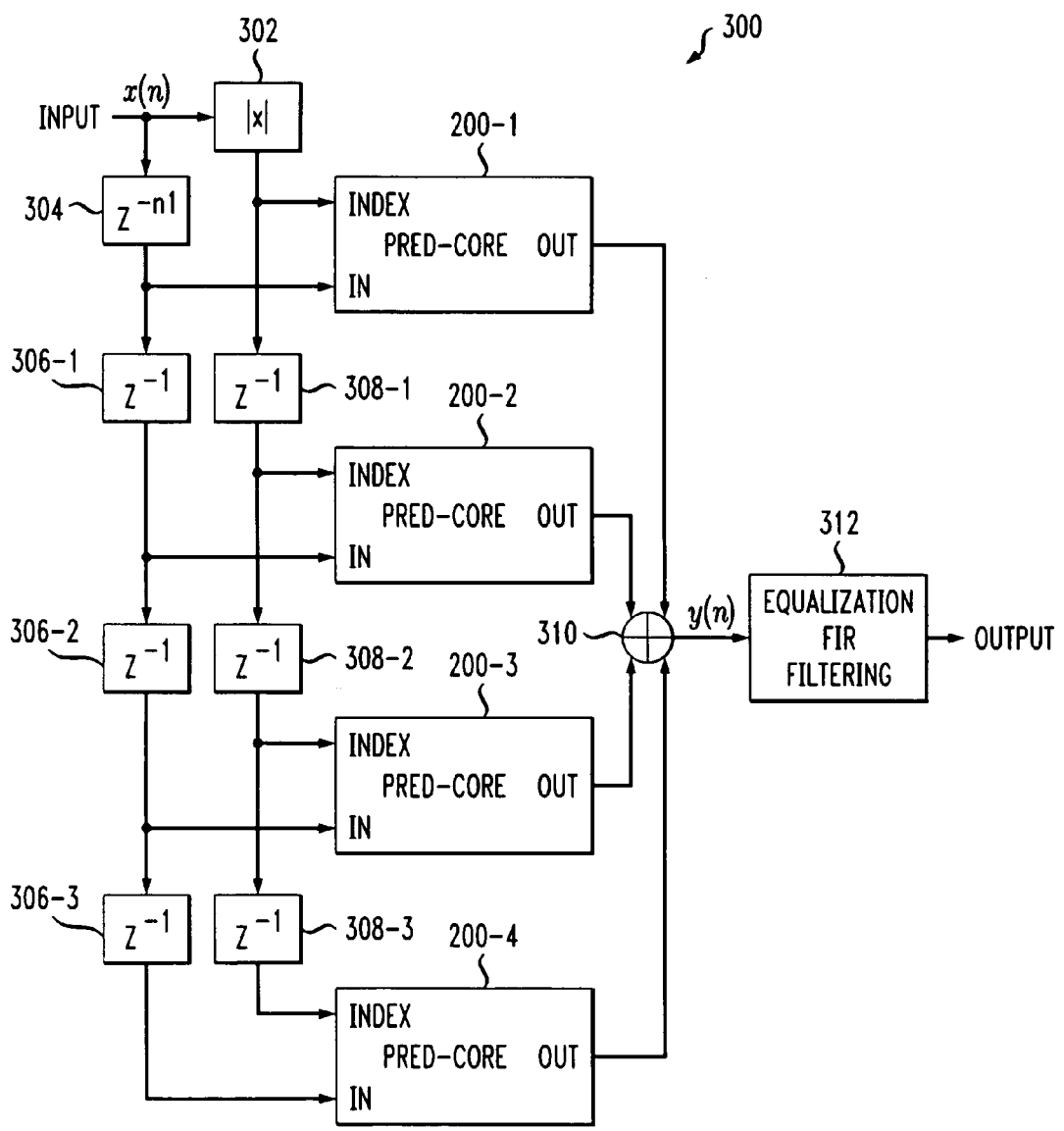
FIG. 3B shows an illustrative embodiment of a predistortion circuit with memory in accordance with the invention, implemented using the predistortion core of FIG. 2 and suitable for use in the system of FIG. 1.

FIG. 3B shows an example of a predistortion circuit 300' with memory that is implemented using four of the Pred-Core circuits 200 of FIG. 2, denoted Pred-Core 200-(k+1), where k=0, 1, 2 . . . (K−1) and K=4 in this embodiment. The input x(n) is applied to absolute value element 302 and to delay element 304. The output of the delay element 304 is applied to the data input of the first Pred-Core circuit 200-1. Further delayed versions generated by delay elements 306-1, 306-2 and 306-3 are applied to the data inputs of the respective Pred-Core circuits 200-2, 200-3 and 200-4. Similarly, the output of the absolute value element 302 is applied to the index input of the first Pred-Core circuit 200-1, and further delayed versions generated by delay elements 30-1, 308-2 and 308-3 are applied to the index inputs of the respective Pred-Core circuits 200-2, 200-3 and 200-4. The outputs of the four Pred-Core circuits are summed in a summing element 310 to generate the output y(n). Like the circuit 300, the circuit 300' includes equalization FIR filtering element 312, which may be eliminated in other embodiments because the circuit 300' has a certain limited amount of built-in equalization. The output of the circuit 300' may thus be viewed as the signal y(n) or a corresponding filtered version thereof.

As is apparent from its configuration as shown in the figure, the predistortion circuit 300' implements the following equation:

$$y(n) = \sum_{k=0}^{K-1} x(n-k) \cdot f_k(|x(n-k)|), \tag{3}$$

where $f_k( )$ denotes a polynomial function associated with the kth Pred-Core circuit 200-(k+1), and K=4 in the FIG. 3B embodiment.

The predistortion circuits 300 and 300' of respective FIGS. 3A and 3B may each be viewed as a type of nonlinear FIR filter.

As indicated previously, the predistortion circuit 300 of FIG. 3A is an example of a circuit which utilizes a memoryless predistortion technique. More particularly, this circuit operates in accordance with a so-called memoryless assumption that nonlinear power amplifier distortion is only dependent on the instantaneous input power or signal amplitude supplied to the amplifier. However, this assumption is only valid to a limited extent. A number of factors may contribute to the presence of a memory effect in power amplifiers, such as junction temperature or capacitance, drain bias decoupling network, reflection from output mismatches, etc. The manner in which the FIG. 3A circuit can be modified to incorporate memory has been described in conjunction with FIG. 3B. Additional examples of predistortion circuits designed to take the memory effect into account will be described with reference to FIGS. 4A, 4B, 5 and 6 below. Before these circuits are described in detail, a behavioral model for the memory effect will be described in order to illustrate the manner in which the memory effect can be compensated for using the predistortion techniques of the invention.

It should be understood that the particular behavioral model to be described is for illustrative purposes only, and not intended to limit the scope of the invention in any way. In other words, the model is intended to provide a useful estimate of the memory effect suitable for illustrating the invention, rather than a particular level of mathematical precision.

The behavioral model makes use of a third-order Volterra response of the type described in Martin Schetzen, "The Volterra and Wiener Theories of Nonlinear Systems," John Wiley and Sons, Inc., 1980, which is incorporated by reference herein. The response is given by:

$$H_3 = \int_{-\infty}^{+\infty} \int_{-\infty}^{+\infty} \int_{-\infty}^{+\infty} h_3(\tau_1, \tau_2, \tau_3) \cdot \tag{4}$$
$$x(t-\tau_1) \cdot x(t-\tau_2) \cdot x(t-\tau_3) \cdot d\tau_1 d\tau_2 d\tau_3$$

where x(t) is a real input signal and $h_3$ is the third-order Volterra kernel. Assuming that the input signal x(t) corresponds to a complex baseband representation, the following approximation may be made:

$$H_3 = \int_{-\infty}^{+\infty}\int_{-\infty}^{+\infty}\int_{-\infty}^{+\infty} h_3(\tau_1, \tau_2, \tau_3) \cdot \qquad (5)$$
$$x(t-\tau_1) \cdot |x(t-\tau_2)| \cdot |x(t-\tau_3)| \cdot d\tau_1 d\tau_2 d\tau_3.$$

Next, if it is assumed that:

$$h_3(\tau_1, \tau_2, \tau_3) = \delta(\tau_1) \cdot h_3(\tau_2) \cdot h_3(\tau_3), \qquad (6)$$

then Equation (5) becomes:

$$H_3 = x(t) \cdot \left( \int_{-\infty}^{+\infty} h_3(\tau) \cdot |x(t-\tau)| \cdot d\tau \right)^2. \qquad (7)$$

This can be generalized to a polynomial as follows:

$$H = x(t) \cdot \sum_k b_k \cdot \left( \int_{-\infty}^{+\infty} h'(\tau) \cdot |x(t-\tau)| \cdot d\tau \right)^k, \qquad (8)$$

where h' denotes an arbitrary filter, e.g., an FIR filter. Then the behavioral model for the power amplifier in the analog domain is given by:

$$y(t) = x(t) \cdot \sum_k a_k \cdot |x(t)|^k + x(t) \cdot \sum_k b_k \cdot \left( \int_{-\infty}^{+\infty} h'(\tau) \cdot |x(t-\tau)| \cdot d\tau \right)^k \qquad (9)$$

or in the discrete time domain by:

$$y(n) = x(n) \cdot \sum_k a_k \cdot |x(n)|^k + x(n) \cdot \sum_k b_k \cdot \left( \sum_j h'(j) \cdot |x(n-j)| \right)^k. \qquad (10)$$

The approximation of the delta function in Equation (6) may be further refined by adding to the model a term that is proportional to the rate the signal is changing:

$$y(n) = x(n) \cdot \sum_k a_k \cdot |x(n)|^k + x(n) \cdot \sum_k b_k \cdot \left( \sum_j h'(j) \cdot |x(n-j)| \right)^k + \qquad (11)$$
$$(x(n) - x(n-1)) \cdot \sum_k c_k \cdot \left( \sum_j h''(j) \cdot |x(n-j)| \right)^k,$$

where h" denotes another arbitrary filter, e.g., another FIR filter. If h' and h" are known quantities, then a minimum mean square error (MMSE) estimate can be made in a straightforward manner for the coefficients $a_k$, $b_k$ and $c_k$.

Optimal tap values for h' and h" can be determined using, for example, a simplex search algorithm such as that described in J. A. Nelder and R. Mead, "A Simplex Method for Function Minimization," Computer Journal, Vol. 7, p. 308, 1965, which is incorporated by reference herein. In practice, it will generally be acceptable to implement h' and h" with approximately three taps. Using the error from the MMSE estimation as the figure of merit, the tap values of h' and h" are adjusted with the search algorithm until convergence is reached. To prevent tap values of h' and h" from growing to infinity, h' and h" are always normalized. In addition, the MMSE estimation is preferably weighted in the frequency domain.

In order to predistort the input signal in a manner which counteracts the memory effect in the above-described behavioral model, one could in principle attempt to obtain the inverse of Equation (11). This is generally an extremely difficult process. Instead, it is possible to simply add to the input signal the residual memory distortion estimated using the model, using the appropriate sign to cancel out the corresponding distortion generated by the power amplifier. An approach of this type is utilized in the predistortion circuits to be described in conjunction with FIGS. 4A and 4B. A substantially continuous update of the predistortion circuit parameters by an associated feedback processing circuit, such as circuit 110 in FIG. 1, eliminates the need to derive the inverse function mathematically, and will provide acceptable performance as long as the amplifier distortion characteristics change more slowly than the rate of update. Another possible technique which eliminates the need to derive the inverse function mathematically is an "indirect learning" approach that involves switching input and output through the same model to obtain the predistortion circuit parameters. This type of technique is described in greater detail in the above-cited U.S. patent applications Ser. No. 09/915,042 and Ser. No. 09/928,628.

Figure 4A:
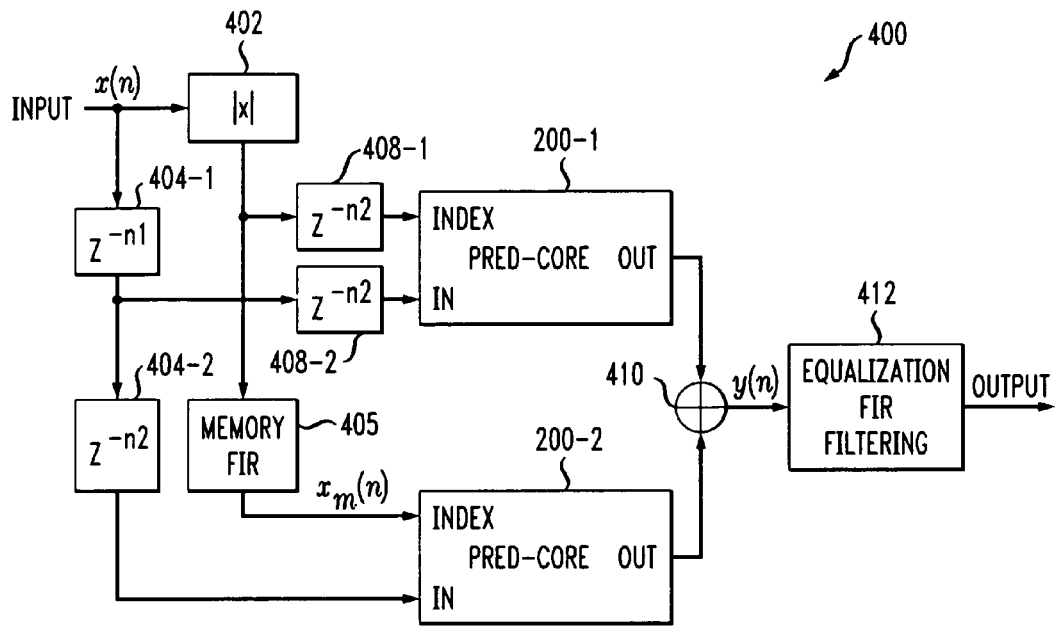
FIG. 4A shows an illustrative embodiment of a single-stage predistortion circuit which includes a memory distortion estimate in accordance with the invention, implemented using the predistortion core of FIG. 2 and suitable for use in the system of FIG. 1.

FIG. 4A shows a single-stage predistortion circuit 400 with memory distortion compensation in accordance with the invention. The circuit 400 in this embodiment can be used to implement the memory effect model as shown in Equation (10) above. As indicated previously, the model as shown in Equation (11) represents a further refinement of the Equation (10) model, and those skilled in the art will recognize that Equation (11) can be implemented in a predistortion circuit in a similar manner.

The circuit 400 is implemented using two of the Pred-Core circuits 200 of FIG. 2, denoted Pred-Core 200-1 and 200-2. The input x(n) is applied to an absolute value element 402 and to a first delay element 404-1. The output of the absolute value element 402 is applied via a delay element 408-1 to the index input of the first Pred-Core circuit 200-1, and is also applied to a memory FIR filter 405. The output of the first delay element 404-1 is applied via a delay element 408-2 to a data input of the first Pred-Core circuit 200-1, and via delay element 404-2 to a data input of the second Pred-Core circuit 200-2. The delays n1 and n2 associated with the delay elements 404 and 408 are selected to provide matching of signal delays in the associated signal paths, as will be readily appreciated by those skilled in the art. The memory FIR filter 405 generates an output $x_m(n)$ that is applied to an index input of the second Pred-Core circuit 200-2. The outputs of the two Pred-Core circuits 200-1 and 200-2 are summed in a summing element 410 to generate the output y(n).

As indicated previously, the delays provided by elements 404-1, 404-2, 408-1 and 408-2 are configured to provide appropriate matching of processing delays, as will be appreciated by those skilled in the art.

Like the circuits 300 and 300' of FIGS. 3A and 3B, the circuit 400 in this embodiment further includes an equalization FIR filtering element 412, which may be eliminated in other embodiments since the circuit 400 has a certain limited amount of built-in equalization. The output of the circuit 400 may thus be viewed as the signal y(n) or a corresponding filtered version thereof. The predistortion circuit 400 implements the following equation:

$$y(n) = x(n) \cdot f_0(|x(n)|) + x(n) \cdot f_1(x_m(n)), \quad (12)$$

where $f_0(\ )$ and $f_1(\ )$ each denote a polynomial associated with the corresponding Pred-Core circuit 200-1 or 200-2. The predistortion circuit 400 may thus be viewed as an example of a predistortion circuit which uses first and second predistortion techniques, each corresponding to one of the addends in the foregoing equation. Additional examples will be described in conjunction with FIGS. 5 and 6 below.

Figure 4B:
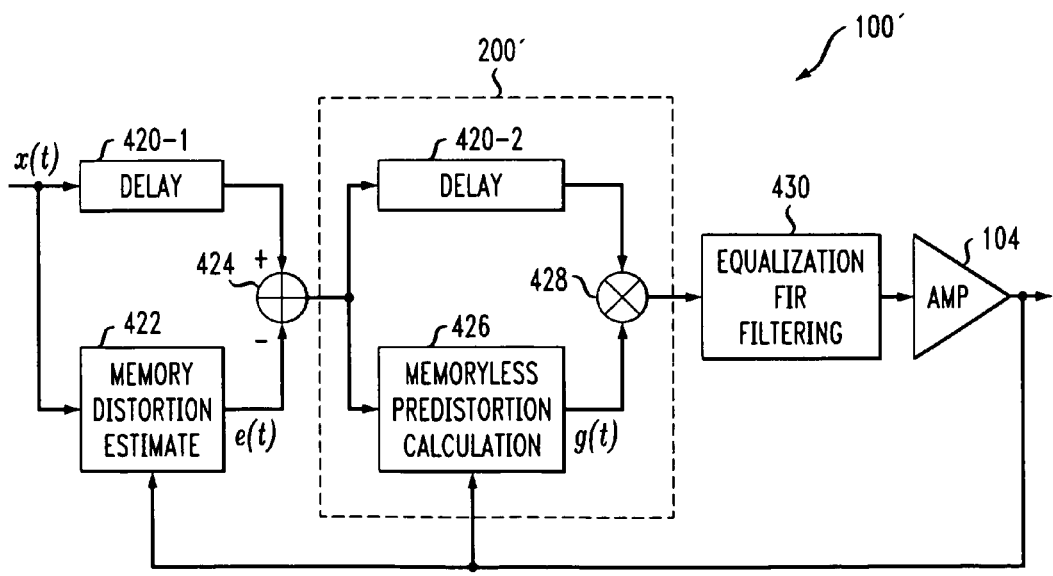
FIG. 4B shows an illustrative embodiment of a two-stage predistortion circuit which includes a memory distortion estimate in accordance with the invention.

The single-stage predistortion circuit of FIG. 4A can also be implemented as a two-stage circuit as illustrated in FIG. 4B. FIG. 4B shows a predistortion circuit suitable for implementing the predistortion of Equation (10) or Equation (11) above in a two-stage configuration. The predistortion circuit is part of a system 100' in which an input signal x(t) is applied to a delay element 420-1 and to a memory distortion estimate element 422. It is to be appreciated that although the two-stage predistortion circuit in FIG. 4B is shown for clarity and simplicity of illustration as using continuous-time analog signals, the processing operations shown can also be implemented in the digital domain using discrete signals. The memory distortion estimate element 422 produces an error signal e(t) which is subtracted from the delayed version of x(t) in element 424 to obtain x(t)-e(t). The result is applied to a delay element 420-2 and to a memoryless predistortion calculation element 426. The memoryless predistortion calculation element 426 generates as an output a complex gain signal g(t) which is then used to multiply x(t)-e(t) in multiplier 428. The resulting predistorted signal is applied via an equalization FIR filtering element 430 to an input of amplifier 104. The output of the amplifier 104 is fed back to the memory and memoryless predistortion elements 422 and 426 as shown. As indicated previously, substantially continuous update via feedback to elements 422 and 426 eliminates the need to derive the inverse of Equation (10) or Equation (11) mathematically, and acceptable performance is provided as long as the amplifier distortion characteristics change more slowly than the rate of update.

The elements 420-2, 426 and 428 of the circuit 100' in FIG. 4B may be collectively viewed as a Pred-Core circuit 200' which operates in a manner similar to that of the Pred-Core circuit 200 as described in conjunction with FIG. 2.

The predistortion circuits of FIGS. 5 and 6, to be described in detail below, are each based on a combination of multiple predistortion techniques. More particularly, in each of these predistortion circuits, a first set of sample values is produced using a first predistortion technique, a second set of sample values is produced using a second predistortion technique, and the first and second sets of sample values are combined to produce a predistorted signal. Each of the predistortion techniques produces its corresponding set of sample values based at least in part on one or more past time spaced input samples relative to a current time spaced input sample. Future time spaced input samples relative to the current time spaced input sample may also be used, as will be described. In one embodiment, the first predistortion technique produces sample values each of which is dependent on one of a plurality of time spaced input samples and independent of any other time spaced input sample, and the second predistortion technique produces sample values each of which is dependent on (i) one of a plurality of past time spaced input samples and (ii) a current time spaced input sample, and independent of any other time spaced input sample.

Figure 5:
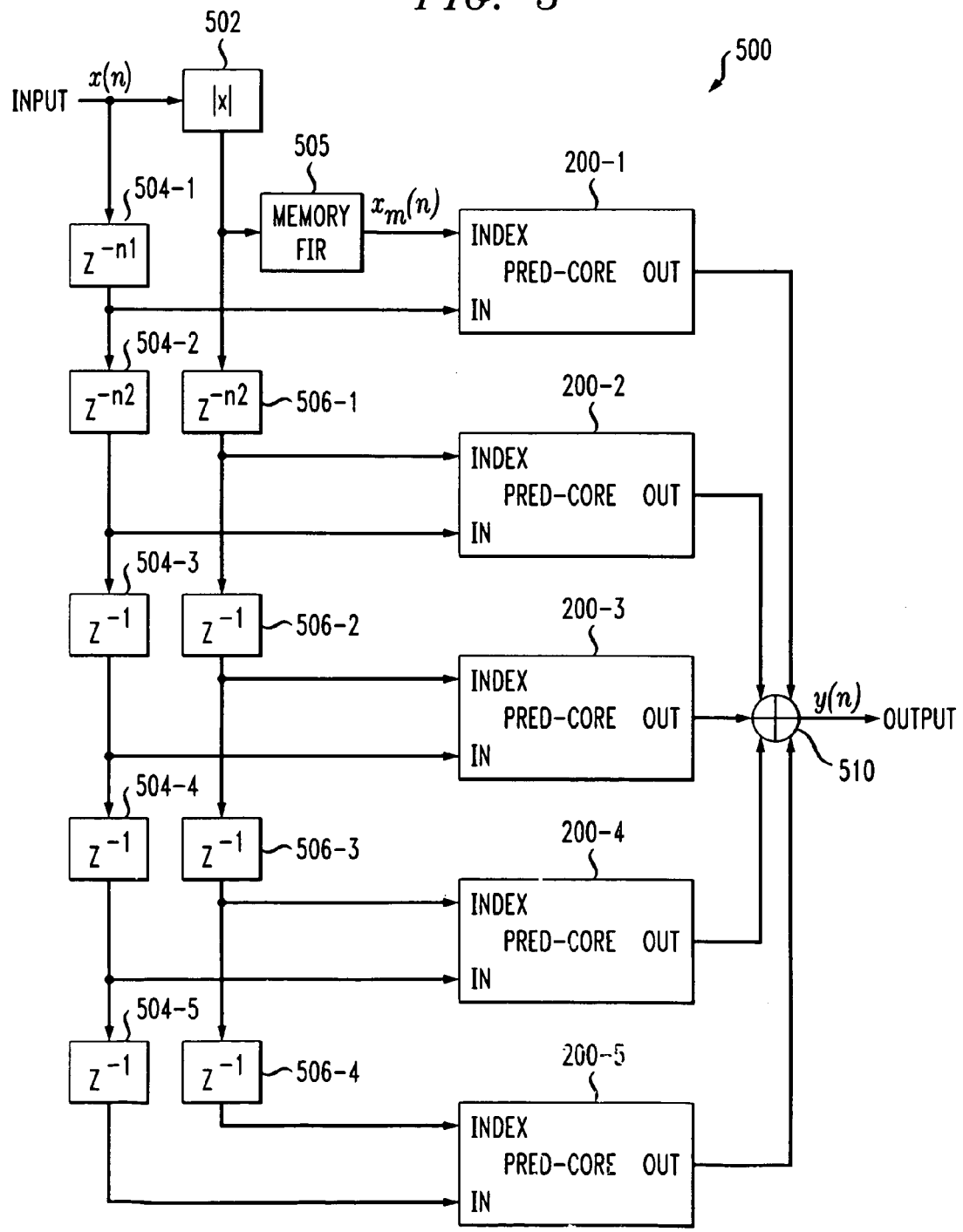
FIGS. 5 and 6 show illustrative embodiments of predistortion circuits based on multiple predistortion techniques in accordance with the invention, implemented using the predistortion core of FIG. 2 and suitable for use in the system of FIG. 1.

FIG. 5 shows a predistortion circuit 500 with memory effect compensation, which uses a combination of multiple predistortion techniques in accordance with the invention. The circuit 500 is implemented using five of the Pred-Core circuits 200 of FIG. 2, denoted Pred-Core 200-(k+1), where k=0, 1, 2, . . . (K−1) and K=5 in this embodiment. As will be apparent from the following description, the circuit 500 uses a combination of multiple functions, each based on current and past signal samples. In addition, it provides an improved equalization capability relative to the circuits 300 and 400 previously described, without the use of additional equalization FIR filtering. It should also be noted that the predistortion parameters in this embodiment are estimated using a Least-Squares-Newton technique.

In the circuit 500, the input x(n) is applied to an absolute value element 502 and to a delay element 504-1. The output of the delay element 504-1 is applied to the data input of the first Pred-Core circuit 200-1. Further delayed versions generated by delay elements 504-2, 504-3, 504-4 and 504-5 are applied to the data inputs of the respective Pred-Core circuits 200-2, 200-3, 200-4 and 200-5. The output of the absolute value element 502 is applied to an input of a memory FIR filter 505 and to an input of a delay element 506-1. The memory FIR filter 505 generates an output $x_m(n)$ that is applied to an index input of the first Pred-Core circuit 200-1. Further delayed versions of the absolute value element output are generated by delay elements 506-1, 506-2, 506-3 and 506-4 and are applied to the index inputs of the respective Pred-Core circuits 200-2, 200-3, 200-4 and 200-5. As in previous embodiments, the delays n1 and n2 associated with the delay elements 504 and 506 are selected to provide matching of signal delays in the associated signal paths. The outputs of the five Pred-Core circuits are summed in a summing element 510 to generate the output y(n). As indicated above, the circuit 500 provides improved equalization relative to that of circuits 300 and 400, and circuit 500 as shown therefore does not include a separate equalization FIR filtering element.

An example of a combination of first and second predistortion techniques that may be provided by the predistortion circuit 500 is given by the following equation:

$$y(n) = \sum_{k=0}^{K-1} x(n-k) \cdot f_k(|x(n-k)|) + x(n) \cdot f'\left(\sum_{l=0}^{L} c_l |x(n-l)|\right), \quad (13)$$

where $c_l$ are coefficients associated with the memory FIR 505. A more particular example showing one possible implementation of Equation (13) is as follows:

$$y(n) = \sum_{k=0}^{K-1} \sum_{p=0}^{P-1} a_{kp} x(n-k) |x(n-k)|^p + \sum_{q=1}^{Q} b_q x(n) \left(\sum_{l=0}^{L} c_l |x(n-l)|\right)^q, \quad (14)$$

where $a_{kp}$ and $b_q$ are coefficients associated with the Pred-Core circuits 200. In the foregoing examples, each of Equations (13) and (14) includes first and second addends, with the first addend corresponding to the first predistortion technique, and the second addend corresponding to the second predistortion technique.

The quantity l in Equations (13) and (14) may be permitted to have a value which is less than zero, such that one or more future time spaced input samples are utilized in the second predistortion technique. Those skilled in the art will recognize that such future samples can be obtained, in effect, by suitably delaying the input signal.

Moreover, the quantity q in Equation (14) is preferably permitted to take on values of two and four, such that if Q=4, the coefficients $c_{ql}$ each have a value of approximately zero for values of q equal to one and three. Other values of q could also be used, e.g., values of two, four and six, and so on.

Figure 6:
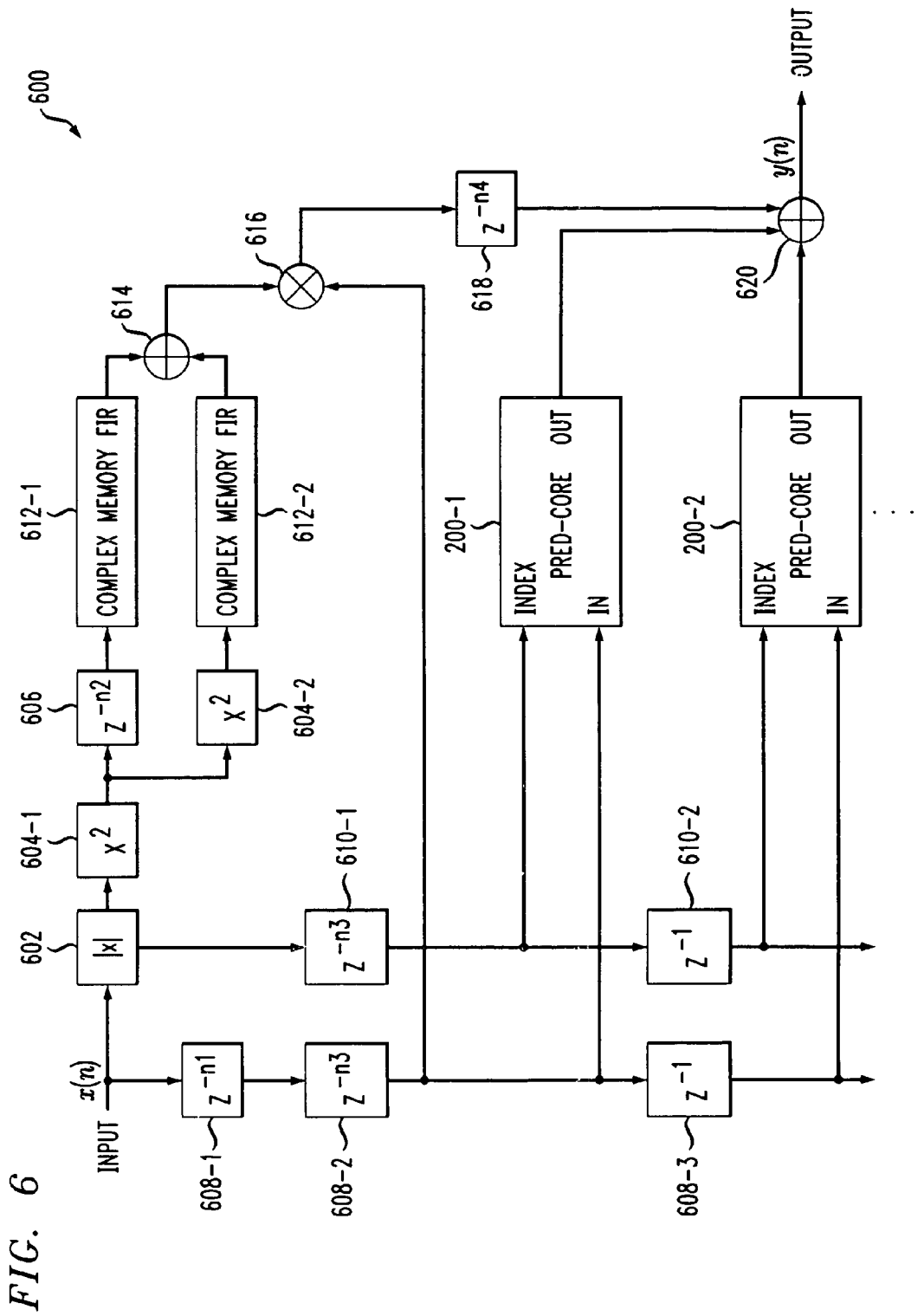

FIG. 6 shows another predistortion circuit 600 based on a combination of multiple predistortion techniques in accordance with the invention, implemented using K Pred-Core circuits, denoted Pred-Core 200-(k+1), where as indicated previously k=0, 1, . . . (K−1). Like the circuit 500 described previously, the circuit 600 provides compensation for the previously-described memory effect. In addition, it provides an improved equalization capability relative to the circuits 300 and 400 previously described, without the use of additional equalization FIR filtering. The predistortion parameters in this embodiment can be estimated using a linear estimation technique, and therefore in a more computationally efficient manner than in the circuit 500.

In the circuit 600, the input x(n) is applied to an absolute value element 602 and to a delay element 608-1. The output of the absolute value element 602 is applied to a first squaring element 604-1, and the output of the first squaring element 604-1 is applied to a delay element 606 and a second squaring element 604-2. The output of the delay element 608-1 is applied to another delay element 608-2, and the output of the delay element 608-2 is applied to a data input of the first Pred-Core circuit 200-1 and to an input of a multiplier 616. A further delayed version of the input x(n) is applied via delay element 608-3 to a data input of the second Pred-Core circuit 200-2, with the data inputs of subsequent Pred-Core circuits being supplied in a similar manner.

The output of the absolute value element 602 is also applied to a delay element 610-1. The output of the delay element 610-1 is applied to an index input of the first Pred-Core circuit 200-1 and via another delay element 610-2 to an index input of the second Pred-Core circuit 200-2. The index inputs of subsequent Pred-Core circuits are supplied in a similar manner.

Implementation-specific delays n1, n2 and n3 associated with the delay elements 606, 608 and 610 are selected to provide matching of signal delays in the associated signal paths, as in previous embodiments.

The outputs of the delay element 606 and the squaring element 604-2 are applied to inputs of respective complex memory FIR filters 612-1 and 612-2. The outputs of these filters are added in a summing element 614, and then multiplied by the delayed version of the input x(n) from delay element 608-2 in multiplier 616. The output of the multiplier 616 is applied via delay element 618, having delay n4, to a summing element 620, in which it is summed with the outputs of the K+1 Pred-Core circuits to produce the predistorted output signal y(n). As indicated above, the circuit 600 provides improved equalization relative to that of circuits 300 and 400, and circuit 600 as shown therefore does not include a separate equalization FIR filtering element.

An example of a combination of first and second predistortion techniques that may be provided by the predistortion circuit 600 is given by the following equation:

$$y(n) = \sum_{k=0}^{K-1} x(n-k) \cdot f_k(|x(n-k)|) + x(n) \cdot \sum_{l=1}^{L} f_l'(|x(n-l)|), \quad (15)$$

where $f_l'$ are functions associated with the complex memory FIR filters 612-1 and 612-2. A more particular example showing one possible implementation of Equation (15) is as follows:

$$y(n) = \sum_{k=0}^{K-1} \sum_{p=0}^{P-1} a_{kp} x(n-k)|x(n-k)|^p + x(n) \sum_{q=1}^{Q} \sum_{l=1}^{L} c_{ql} |x(n-l)|^q, \quad (16)$$

where $a_{kp}$ are coefficients of the predistortion core circuits, and $c_{ql}$ are coefficients of the complex memory FIR filters 612-1 and 612-2.

Another version of Equation (16) that incorporates delay terms in the second predistortion technique is given by:

$$y(n) = \sum_{k=0}^{K-1} \sum_{p=0}^{P-1} a_{kp} x(n-k)|x(n-k)|^p + \sum_{q=1}^{Q} \sum_{l=1}^{L} \sum_{m=1}^{M} c_{qlm} x(n-m)|x(n-l-m)|^q, \quad (17)$$

As was the case with the example combinations given previously for the circuit 500, the quantity l in Equations (15), (16) and (17) may be permitted to have a value which is less than zero, such that one or more future time spaced input samples are utilized in the second predistortion technique. Also, the quantity q in Equations (16) and (17) is preferably permitted to take on values of two and four, with coefficients for other values being zero, although other arrangements could also be used.

An example set of coefficients $a_{kp}$ and $c_{ql}$ for implementing Equation (16), with K=4, P=5 and L=20, in the predistortion circuit 600 of FIG. 6, is as follows:

Complex polynomial coefficients $a_{kp}$ (4th order) for Pred-Core 200-1 (k=0):
p=4: 28.0571+12.5238i
p=3: 19.9513+1.2119i
p=2: −10.9708+1.1993i
p=1: 1.6333−0.3566i
p=0: 0.9733−0.0117i Complex polynomial coefficients $a_{kp}$ (4th order) for Pred-Core 200-2 (k=1):
p=4: −72.1503−41.9981i
p=3: 35.6383+20.0715i
p=2: −4.7463−3.7298i
p=1: 0.1857+0.2715i
p=0: −0.1135+0.0618i Complex polynomial coefficients $a_{kp}$ (4th order) for Pred-Core 200-3 (k=2):
p=4: 65.2435+41.4201i
p=3: −30.9720−23.0535i
p=2: 4.4637+4.8583i
p=1: −0.2270−0.4194i
p=0: 0.1212−0.0924i Complex polynomial coefficients $a_{kp}$ (4th order) for Pred-Core 200-4 (k=3):
p=4: −41.8007−23.3570i
p=3: 21.2478+13.1256i
p=2: −3.5915−2.8084i
p=1: 0.2387+0.2607i
p=0: −0.0445+0.0312i
Complex coefficients $c_{ql}$ for memory FIR 612-1 (q=2):
l=1: 0.8151+1.7174i
l=2: −5.4640−4.3166i
l=3: 7.4416+5.2334i
l=4: −4.0328−2.9027i
l=5: −1.4101−0.6602i
l=6: 2.7418+1.2691i
l=7: 0.8353+1.5226i
l=8: −3.3820−3.5678i
l=9: 1.4578+2.1431i
l=10: 1.4680+0.1694i
l=11: −1.1656−0.0994i
l=12: −0.9720−1.3719i
l=13: 1.0293+1.2898i
l=14: 1.1067+0.4580i
l=15: −2.1977−1.4159i
l=16: 0.9022+0.5296i
l=17: 0.8818+0.7703i
l=18: −1.3104−1.0579i
l=19: 0.6831+0.5474i
l=20: −0.1345−0.1095i
Complex coefficients $c_{ql}$ for memory FIR 612-2 (q=4):
l=1: −15.0097−9.7009i
l=2: 16.5690+16.1563i
l=3: −18.4896−21.8050i
l=4: 17.6098+24.5802i
l=5: −13.2506−23.7639i
l=6: 9.5893+21.7037i
l=7: −8.0826−20.4009i
l=8: 6.9506+18.9063i
l=9: −5.2490−16.4669i
l=10: 2.7313+13.1311i
l=11: −0.4989−9.9384i
l=12: −0.9607+7.2421i
l=13: 2.0038−4.7525i
l=14: −3.0947+2.2966i
l=15: 3.7987−0.2665i
l=16: −3.7164−0.8273i
l=17: 2.6026+0.7157i
l=18: −1.3585−0.2470i
l=19: 0.7411+0.1912i
l=20: −0.3795−0.1591i It should be emphasized that the above example coefficients are provided for illustrative purposes only, and should not be construed as limiting the scope of the invention in any way. Those skilled in the art will appreciate that other arrangements can be used.

Although only two different predistortion techniques are used in the examples associated with FIGS. 4, 5 and 6, other embodiments of the invention can use combinations of more than two different predistortion techniques. It should also be noted that a given embodiment of the invention may utilize only a particular one of the two predistortion techniques utilized in the predistortion circuits of FIGS. 4, 5 and 6.

The above-described embodiments of the invention are intended to be illustrative only. For example, the particular memory filtering arrangements shown are by way of example, and other types of memory filtering may be used in alternative embodiments of the invention. In addition, the predistortion core circuit and the particular numbers and arrangements thereof within the described predistortion circuits may be varied. The predistortion techniques of the invention can be implemented in hardware, software, firmware or combinations thereof. These and numerous other alternative embodiments within the scope of the following claims will be readily apparent to those skilled in the art.

We claim:

1. A method of predistorting a signal, said method comprising:
producing a set of sample values, each of at least a subset of which is dependent on (i) at least one of a plurality of past time spaced input samples and (ii) a current time spaced input sample, and independent of any other time spaced input sample; and
combining said sample values to produce a predistorted signal;
wherein the predistorted signal is subsequently subject to at least one nonlinear processing operation and is configured to at least partially cancel out nonlinearity-related effects of said at least one nonlinear processing operation;
wherein the predistorted signal is of a form given by the following equation:

$$y(n)=x(n) \cdot f_0(|x(n)|)+x(n) \cdot f_1(x_m(n)),$$

where y(n) denotes the predistorted signal, x(n) denotes a corresponding input signal, $x_m(n)$ denotes a memory-filtered version of the input signal, and $f_0( )$ and $f_1( )$ each denote a polynomial function.

2. The method of claim 1 wherein the producing step comprises producing the corresponding set of sample values by processing input samples associated with an input signal.

3. The method of claim 1 wherein the producing step comprises producing at least one of the sample values based at least in pad on one or more future time spaced input samples relative to a current time spaced input sample.

4. A method of predistorting a signal, said method comprising:
producing a set of sample values, each of at least a subset of which is dependent on (i) at least one of a plurality of past time spaced input samples and (ii) a current time spaced input sample, and independent of any other time spaced input sample; and
combining said sample values to produce a predistorted signal;
wherein the predistorted signal is subsequently subject to at least one nonlinear processing operation and is configured to at least partially cancel out nonlinearity-related effects of said at least one nonlinear processing operation;
wherein the predistorted signal is of a form given by the following equation:

$$y(n) = x(n) \cdot f\left(\sum_{l=0}^{L} c_l |x(n-l)|\right),$$

where y(n) denotes the predistorted signal, x(n) denotes a corresponding input signal, $f$ denotes a function, and $c_l$ are coefficients of one or more memory filters used in producing at least a portion of the set of sample values.

5. The method of claim 4 wherein at least a subset of the coefficients are generated using a least-squares Newton estimation technique.

6. The method of claim 4 wherein the equation is more particularly given by:

$$y(n) = \sum_{q=1}^{Q} b_q x(n) \left( \sum_{l=0}^{L} c_l |x(n-l)| \right)^q,$$

where $b_q$ are coefficients of one or more predistortion core circuits used in producing at least a portion of the set of sample values.

7. The method of claim 4 wherein the quantity l is permitted to have a value which is less than zero, such that one or more future time spaced input samples are utilized to produce one or more of the sample values.

8. A method of predistorting a signal, said method comprising:
producing a set of sample values, each of at least a subset of which is dependent on (i) at least one of a plurality of past time spaced input samples and (ii) a current time spaced input sample, and independent of any other time spaced input sample; and
combining said sample values to produce a predistorted signal;
wherein the predistorted signal is subsequently subject to at least one nonlinear processing operation and is configured to at least partially cancel out nonlinearity-related effects of said at least one nonlinear processing operation;
wherein the predistorted signal is of a form given by the following equation:

$$y(n) = x(n) \cdot \sum_{l=1}^{L} f_l(|x(n-l)|),$$

where $y(n)$ denotes the predistorted signal, $x(n)$ denotes a corresponding input signal, and $f_l$ denotes a function.

9. The method of claim 8 wherein the equation is more particularly given by:

$$y(n) = x(n) \sum_{q=1}^{Q} \sum_{l=1}^{L} c_{ql} |x(n-l)|^q,$$

where $c_{ql}$ are coefficients of one or more memory filters used in producing at least a portion of the set of sample values.

10. The method of claim 9 wherein at least a subset of the coefficients are generated using a linear estimation technique.

11. The method of claim 9 wherein the coefficients $c_{ql}$ each have a value of approximately zero for values of q equal to one and three.

12. The method of claim 8 wherein the quantity l is permitted to have a value which is less than zero, such that one or more future time spaced input samples are utilized to produce one or more of the sample values.

13. An apparatus for predistorting a signal, the apparatus comprising:
predistortion circuitry adapted to produce a set of sample values, each of at least a subset of which is dependent on (i) at least one of a plurality of past time spaced input samples and (ii) a current time spaced input sample, and independent of any other time spaced input sample, and to combine said sample values to produce a predistorted signal;
wherein the predistortion circuitry comprises a plurality of predistortion core circuits, each of the predistortion core circuits receiving a data input and an index input associated with a particular input sample and generating a corresponding data output.

14. The apparatus of claim 13 wherein a given one of the predistortion core circuits includes a first processing element comprising at least one of a coefficient lookup table and a polynomial generator, the first processing element receiving the index input and generating an output which is applied to a second processing element comprising a multiplier which multiplies the output of the first processing element and the data input to generate the corresponding data output.

15. The apparatus of claim 13 wherein data outputs of the predistortion core circuits each correspond to one of the sample values.

16. The apparatus of claim 13 wherein the predistortion circuitry comprises at least one memory finite impulse response (FIR) filter which processes at least one input sample in producing at least one of the sample values.

17. The apparatus of claim 16 wherein the memory FIR filter generates an output which is supplied to a predistortion core circuit in the predistortion circuitry, the predistortion core circuit producing at least a subset of the sample values.

18. An article of manufacture comprising a processor-readable storage medium for storing program code, wherein the program code when executed implements a method of predistorting a signal, said method comprising the steps of:
producing a set of sample values, each of at least a subset of which is dependent on (i) at least one of a plurality of past time spaced input samples and (ii) a current time spaced input sample, and independent of any other time spaced input sample; and
combining said sample values to produce a predistorted signal;
wherein the predistorted signal is subsequently subject to at least one nonlinear processing operation and is configured to at least partially cancel out nonlinearity-related effects of said at least one nonlinear processing operation.

* * * * *

UNITED STATES PATENT AND TRADEMARK OFFICE
CERTIFICATE OF CORRECTION

PATENT NO. : 7,269,231 B2
APPLICATION NO. : 10/159540
DATED : September 11, 2007
INVENTOR(S) : L. Ding et al.

It is certified that error appears in the above-identified patent and that said Letters Patent is hereby corrected as shown below:

In the specification:

Col. 2, line 27, delete "l" and insert --*l*--.

Col. 11, line 4, delete "l" and insert --*l*--.

Col. 12, line 35, delete "l" and insert --*l*--.

Col. 13, lines 9 through 28, please delete the following:

"1 = 1:    0.8151 + 1.7174i
1 = 2:    -5.4640 - 4.3166i
1 = 3:    7.4416 + 5.2334i
1 = 4:    -4.0328 - 2.9027I
1 = 5:    -1.4101 - 0.6602i
1 = 6:    2.7418 + 1.2691i
1 = 7:    0.8353 + 1.5226i
1 = 8:    -3.3820 - 3.5678i
1 = 9:    1.4578 + 2.1431i
1 = 10:    1.4680 + 0.1694i
1 = 11:    -1.1656 - 0.0994i
1 = 12:    -0.9720 - 1.3719i
1 = 13:    1.0293 + 1.2898i
1 = 14:    1.1067 + 0.4580i
1 = 15:    -2.1977 - 1.4159i
1 = 16:    0.9022 + 0.5296i
1 = 17:    0.8818 + 0.7703i
1 = 18:    -1.3104 - 1.0579i
1 = 19:    0.6831 + 0.5474i
1 = 20:    -0.1345 - 0.1095i"

UNITED STATES PATENT AND TRADEMARK OFFICE
CERTIFICATE OF CORRECTION

PATENT NO.        : 7,269,231 B2                                          Page 2 of 4
APPLICATION NO.   : 10/159540
DATED             : September 11, 2007
INVENTOR(S)       : L. Ding et al.

It is certified that error appears in the above-identified patent and that said Letters Patent is hereby corrected as shown below:

And insert the following:
--$l = 1: 0.8151 + 1.7174i$
$l = 2: -5.4640 - 4.3166i$
$l = 3: 7.4416 + 5.2334i$
$l = 4: 4.0328 - 2.9027i$
$l = 5: -1.4101 - 0.6602i$
$l = 6: 2.7418 + 1.2691i$
$l = 7: 0.8353 + 1.5226i$
$l = 8: -3.3820 - 3.5678i$
$l = 9: 1.4578 + 2.1431i$
$l = 10: 1.4680 + 0.1694i$
$l = 11: -1.1656 - 0.0994i$
$l = 12: -0.9720 - 1.3719i$
$l = 13: 1.0293 + 1.2898i$
$l = 14: 1.1067 + 0.4580i$
$l = 15: -2.1977 - 1.4159i$
$l = 16: 0.9022 + 0.5296i$
$l = 17: 0.8818 + 0.7703i$
$l = 18: -1.3104 - 1.0579i$
$l = 19: 0.6831 + 0.5474i$
$l = 20: -0.1345 - 0.1095i$--

UNITED STATES PATENT AND TRADEMARK OFFICE
CERTIFICATE OF CORRECTION

PATENT NO. : 7,269,231 B2
APPLICATION NO. : 10/159540
DATED : September 11, 2007
INVENTOR(S) : L. Ding et al.

It is certified that error appears in the above-identified patent and that said Letters Patent is hereby corrected as shown below:

Col. 13, Lines 30 through 49, please delete the following:

"1 = 1: -15.0097 - 9.7009i
1 = 2: 16.5690 +16.1563i
1 = 3: -18.4896 -21.8050i
1 = 4: 17.6098 +24.5802i
1 = 5: -13.2506 -23.7639i
1 = 6: 9.5893 +21.7037i
1 = 7: -8.0826 -20.4009i
1 = 8: 6.9506 +18.9063i
1 = 9: -5.2490 -16.4669i
1 = 10: 2.7313 +13.1311i
1 = 11: -0.4989 - 9.9384i
1 = 12: -0.9607 + 7.2421i
1 = 13: 2.0038 - 4.7525i
1 = 14: -3.0947 + 2.2966i
1 = 15: 3.7987 - 0.2665i
1 = 16: -3.7164 - 0.8273i
1 = 17: 2.6026 + 0.7157i
1 = 18: -1.3585 - 0.2470i
1 = 19: 0.7411 + 0.1912i
1 = 20: -0.3795 - 0.1591i"

UNITED STATES PATENT AND TRADEMARK OFFICE
CERTIFICATE OF CORRECTION

PATENT NO. : 7,269,231 B2
APPLICATION NO. : 10/159540
DATED : September 11, 2007
INVENTOR(S) : L. Ding et al.

It is certified that error appears in the above-identified patent and that said Letters Patent is hereby corrected as shown below:

And insert the following:
--$l = 1$: -15.0097 - 9.7009i
$l = 2$: 16.5690 +16.1563i
$l = 3$: -18.4896 -21.8050i
$l = 4$: 17.6098 +24.5802i
$l = 5$: -13.2506 -23.7639i
$l = 6$: 9.5893 +21.7037i
$l = 7$: -8.0826 -20.4009i
$l = 8$: 6.9506 +18.9063i
$l = 9$: -5.2490 -16.4669i
$l = 10$: 2.7313 +13.1311i
$l = 11$: -0.4989 - 9.9384i
$l = 12$: -0.9607 + 7.2421i
$l = 13$: 2.0038 - 4.7525i
$l = 14$: -3.0947 + 2.2966i
$l = 15$: 3.7987 - 0.2665i
$l = 16$: -3.7164 - 0.8273i
$l = 17$: 2.6026 + 0.7157i
$l = 18$: -1.3585 - 0.2470i
$l = 19$: 0.7411 + 0.1912i
$l = 20$: -0.3795 - 0.1591i--

In the Claims:

Claim 7, col. 15, line 13, delete "1" and insert --$l$--.

Claim 12, col. 16, line 1, delete "1" and insert --$l$--.

Signed and Sealed this

Eleventh Day of December, 2007

JON W. DUDAS
*Director of the United States Patent and Trademark Office*